US005665928A

United States Patent [19]

Wang

[11] Patent Number: 5,665,928

[45] Date of Patent: Sep. 9, 1997

[54] METHOD AND APPARATUS FOR SPLINE PARAMETER TRANSITIONS IN SOUND SYNTHESIS

[75] Inventor: Avery L. Wang, Redwood City, Calif.

[73] Assignee: Chromatic Research, Sunnyvale, Calif.

[21] Appl. No.: 555,626

[22] Filed: Nov. 9, 1995

[51] Int. Cl.[6] .............................. G10H 7/00; H03F 1/26

[52] U.S. Cl. .............................................. 84/621; 84/665

[58] Field of Search .............................. 84/621, 626, 633, 84/662, 665, 683

[56] References Cited

U.S. PATENT DOCUMENTS

| | | | |
|---|---|---|---|
| 3,878,382 | 4/1975 | Bjor et al. . | |
| 4,901,615 | 2/1990 | Matsushima et al. . | |
| 5,403,971 | 4/1995 | Aoki | 84/628 X |
| 5,428,728 | 6/1995 | Lung et al. | 395/150 |

*Primary Examiner*—William M. Shoop, Jr.
*Assistant Examiner*—Jeffrey W. Donels
*Attorney, Agent, or Firm*—Skjerven, Morrill, MacPherson, Franklin & Friel; Norman R. Klivans

[57] ABSTRACT

In a sound (music) synthesis system, a transition between levels of a sound parameter (e.g. volume) is synthesized by fitting a cubic (third degree) spline function between two discontinuous parameter levels. This advantageously eliminates any sound artifacts (pops or clicks) which would otherwise be present due to abrupt changes in the parameter. The cubic spline is fitted (interpolated) to match both the parameter value and its derivative with respect to time at each of the adjacent parameter levels on either side of the transition. The transition thus is advantageously kept brief and in addition it is possible to deal with the situation when the parameter dynamically changes during the transition period, again without causing undesirable sound artifacts.

33 Claims, 3 Drawing Sheets

Microfiche Appendix Included
(1 Microfiche, 32 Pages)

METHOD AND APPARATUS FOR SPLINE PARAMETER TRANSITIONS IN SOUND SYNTHESIS

MICROFICHE APPENDIX

This disclosure includes a Microfiche Appendix having 1 fiche and 32 total frames. This appendix includes a computer program and is subject to copyright protection. The copyright owner has no objection to facsimile reproduction of the patent document and material in Patent Office files, but otherwise reserves all copyright rights whatsoever.

BACKGROUND OF THE INVENTION

1. Field of the Invention

This invention relates to sound synthesis and more specifically to a method and apparatus for preventing sound artifacts (pops and clicks and "zipper" noise) when a sound parameter such as volume level is changed.

2. Description of the Prior Art

In sound synthesis it is well known that when a sound parameter, such as volume changes, undesirable sound artifacts such as clicks or pops occur. These are wideband sound artifacts caused by an abrupt transition in the sound parameter. These artifacts are also called control noise. FIG. 1A shows graphically a sound waveform 10 inside a volume envelope 12 experiencing an abrupt transition, having corners 14, 16. The horizontal axis is time and the vertical axis is sound volume. The artifacts occur at the time of the transition (at corners 14, 16).

Prior art methods to eliminate these artifacts include linear and exponential ramping as shown respectively in FIGS. 1A and 1B. In FIG. 1B a linear ramp 18 is provided between the higher sound level at time $t_0$ 20 and the lower sound level at time $t_1$ 26. This is instead of an abrupt vertical drop as in FIG. 1A which causes the undesirable clicks or pops. A better solution is shown in FIG. 1C where at the lower end of the ramp 22, an exponential decay 24 is provided (an exponential ramp). However, the examples of FIGS. 1B and 1C, even though they cause less of a problem than the vertical change of FIG. 1A, still have the problem that at the corners 20, 26 in FIG. 1B and the single corner 28 in FIG. 1C, the derivative of the ramp function at the corner is discontinuous causing a click or pop. Thus these prior art solutions still have sharp, non-differentiable transitions at the corners and thus are not complete solutions.

Another solution is to provide an extended muting period i.e., stretch out the length of the ramp over a much greater time, thus further reducing the sharpness of the corners. However, this still does not completely eliminate the corners and requires a longer time, thus preventing a rapid change in the sound parameter. The muting approach may take as long as 1/10th of a second using an exponential or linear ramp and still not provide complete elimination of the clicking or popping artifacts. Also, the prior art approaches are not capable of dealing with a dynamically changing parameter where the ramp endpoint changes in the middle of ramp, as shown in FIG. 1D, causing a discontinuity at corner 30 in the volume envelope 31, due to a later upward change in target volume level during an earlier downward volume ramp.

SUMMARY

In accordance with the present invention instead of using a linear or exponential function linking the two sound parameter levels, a cubic spline function is fitted (interpolated) between the two levels of the sound parameter. The cubic spline is matched at both its end points to both the parameter value and its derivative (with respect to time) of the adjacent two parameter levels. For transitions between constant parameter values, the derivatives are set to zero at both ends of the spline function transition and the end points are also made to match up. This consumes all four degrees of freedom in the cubic polynomial.

For cases where the sound parameter is being dynamically adjusted, there may be a continuous set of input events specifying new volume values. To avoid the resulting undesirable control noise, for this case the sound parameter and its derivative are also changed smoothly and dynamically. Typically there is a fixed transition interval in which the parameter value is allowed to transition. The interval is mapped over a particular time interval. A cubic spline is fitted dynamically at the beginning of the interval at the moment the transition begins. The end points are matched up and the target derivative of the cubic spline function is set to zero and the derivative is matched at the starting point.

Thus the only case when an initial (beginning of the transition) derivative might not be identically zero is if the parameter value is already ramping. This happens if a new target value of the parameter is specified before the old target value has been reached, during the continued series of adjustments of the parameter level. In this case the dynamic adjustment is used to recompute the spline polynomial coefficients to match the end points and derivatives. Thus one insures smoothness and one continuous derivative over the entire transition period.

Thus in accordance with the invention there is provided a general mechanism for sound parameter updates. The sound parameter is typically volume but can be other parameters such as frequency, for instance a center frequency for a parametric equalizer. A relatively computationally intensive approach is used to calculate the cubic splines, but this is well within the capabilities of currently available digital signal processors.

Moreover, as described above, the present invention advantageously deals with the case of the dynamically changing target value, i.e. in which the target value changes before the transition is complete. The prior art linear and exponential ramp approaches have been found to be ineffective in this case, giving rise to zipper noise due to discontinuities in the envelope's derivative. However, the present approach deals successfully with this dynamically changing target value case.

It is to be noted that the sound parameters described herein typically change for instance (1) under user control (the user adjusting the volume envelope) or (2) in the case of music, in a "note stealing" situation. This happens where there is an insufficient number of oscillators in a sound synthesis system to support all of the needed notes. Then the quietest note is turned off and its resources switched to a new note. In this case, in the prior art the abrupt resulting transition results in a click or pop, and which is eliminated in accordance with the present invention.

Also, in accordance with the present invention the spline ramping is used only when an actual transition is detected; otherwise (which is most of the time) the spline fitting function is turned off and no ramping is used.

DETAILED DESCRIPTION

Figure 1A:
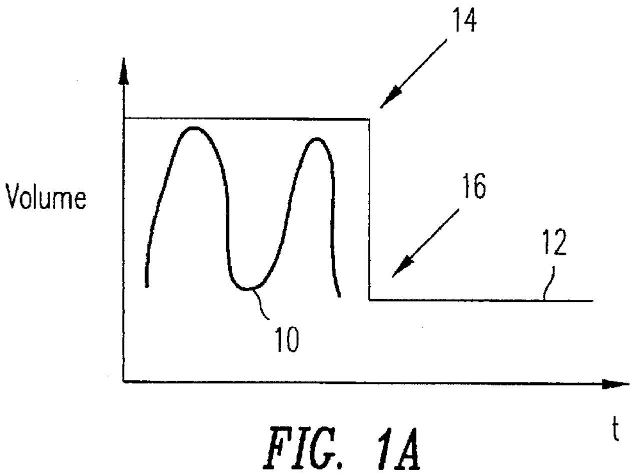
FIG. 1A (Prior Art)
FIG. 1A shows an abrupt transition in a sound parameter envelope.
Figure 1B:
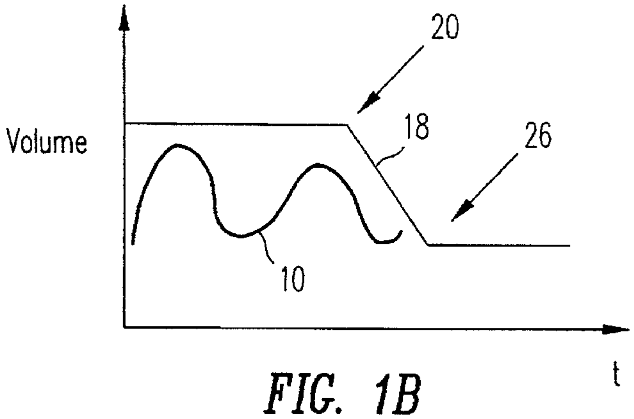
FIG. 1B (Prior Art)
FIGS. 1B and 1C show in the prior art respectively a linear ramp to overcome the technical problem shown in FIG. 1A and an exponential ramp to overcome that problem.
Figure 1C:
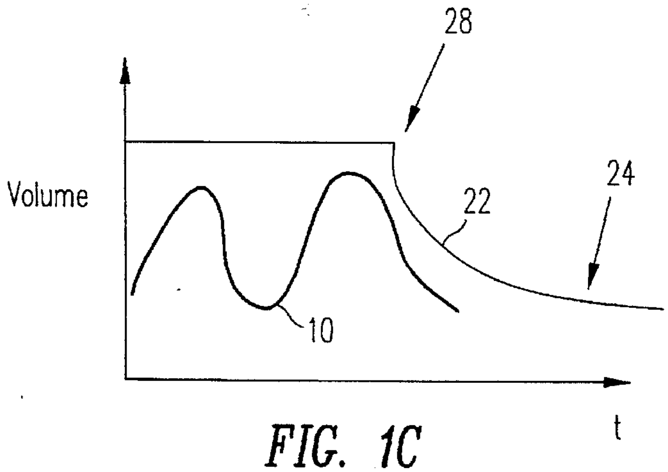
FIG. 1C (Prior Art)
Figure 1D:
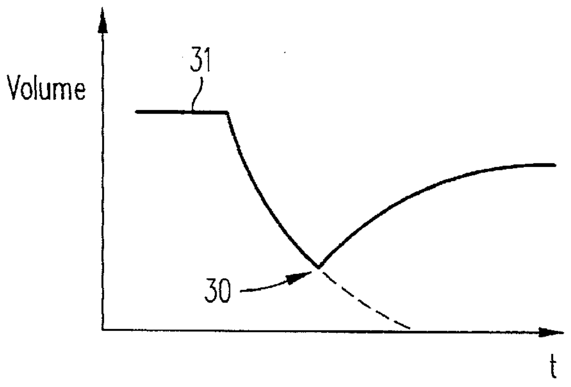
FIG. 1D shows a dynamic transition in a sound parameter envelope.
Figure 2:
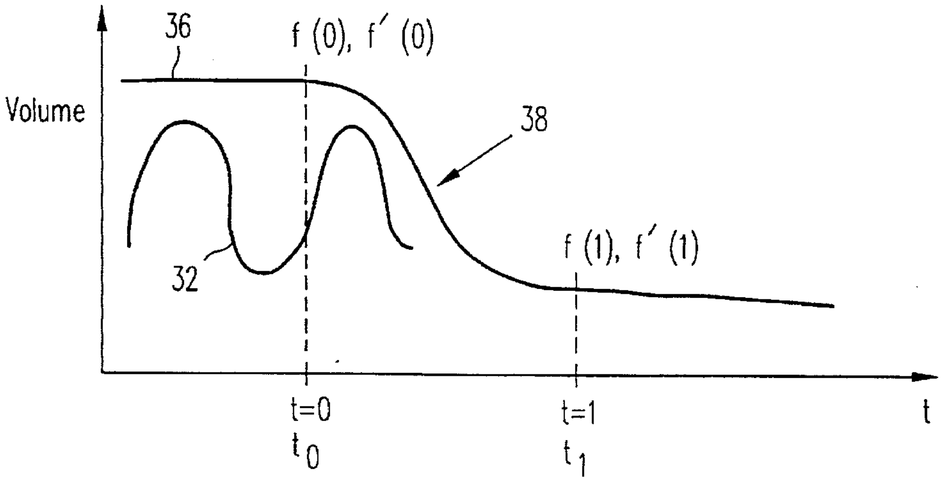
FIG. 2 shows a cubic spline curve interpolated between two sound parameter levels to eliminate sound artifacts.

FIG. 2 shows graphically in accordance with the present invention the fitting (interpolation) of a cubic spline to link two discontinuous levels of a parameter of a sound. In this example (as above), the parameter is volume. It is to be understood that other parameters such as a center frequency of a parametric equalizer or resampling rate may be used. This graph shows (similar to FIGS. 1A, 1B and 1C) a typical sound as a sinusoidal waveform 32 with the desired volume envelope (level) 36. A mathematical function describing level 36 is f(t); thus the level 36 is a function of the time variable t shown along the horizontal axis. As shown, the volume level 36 is constant up to a time $t=t_0$. Then a transition is made to a lower volume level. (A transition to a higher volume level is handled similarly.) The transition period is the time $t=t_0$ to $t=t_0+\Delta$.

Thus in algebraic terms the volume level is $f(t_0)$ at $t=t_0$ and is $f(t_0+\Delta)$ at $t=t_0+\Delta$. Similarly the slope of this function, (df/dt) is expressed as $f'(t_0)$ at $t=t_0$ and $f'(t_0+\Delta)$ at $t=t_0+\Delta$. Thus the cubic spline is the reverse S-shaped curve 38 extending from $t=t_0$ to $t=t_0+\Delta$. As explained above, curve 38 is matched at its end points (at $t=t_0$ and $t=t_0+\Delta$) to both the value and the derivative with respect to time of the adjacent segments of volume level 36, which are the horizontal portions of the volume envelope.

Thus, as shown in FIG. 2, for transitions between constant values of volume, the derivatives are set to zero at both ends i.e., $t=t_0$ and $t=t_0+\Delta$ of the spline curve, and its end points are also made to match up. This consumes all four degrees of freedom as explained below. FIG. 2 thus shows the relatively simple case for transitions between constant volume values.

Figure 3:
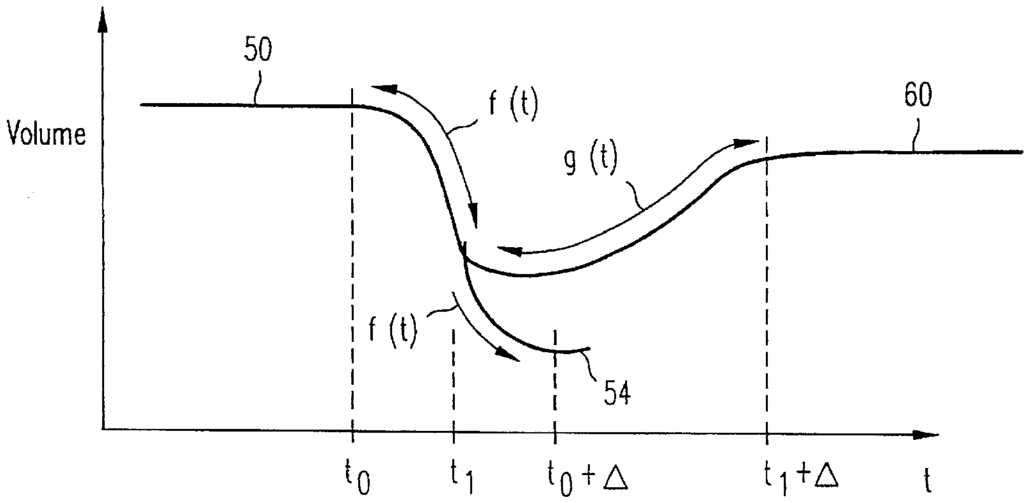
FIG. 3 shows fitting of two linking cubic spline curves in the case of a dynamically changing sound volume parameter.

The more complicated case explained above, and which is even more problematic in the prior art linear or exponential ramping approach, is where the volume level is being adjusted dynamically, up or down. In this case there is e.g. a stream of input events specifying new volume values. To avoid so-called "zipper noise", in accordance with the invention one changes the effective volume parameter values and their derivatives smoothly. Typically there is a fixed transition interval in which the parameter value is allowed to transition. The interval is mapped in accordance with the present invention as shown in FIG. 3 over a normalized time interval, here for instance, t=−1 to 1, corresponding to the desired transition interval. (Thus t here is not the actual time value, but is normalized over a particular arbitrary length transition interval which is mapped to [−1, 1].) It has been found that it is more advantageous due to considerations of numerical accuracy with fixed point arithmetic to use a normalized time interval of −1 to 1, rather than 0 to 1, but otherwise these time intervals are equivalent.

Thus as shown in FIG. 3 a first cubic spline f(t) is fitted at the beginning of the interval beginning at $t_0$ when the first transition is specified. In this case, the first transition is from the lefthand portion of the volume envelope at 50 down to the lower transition level 54, as shown by f(t). Here again the transition period has a duration Δ. As described above, the cubic spline end points which are at volume level 50 at $t=t_0$ and the volume level 54 at time $t_0+\Delta$ are matched up, and the target derivative value $f'(t_0+\Delta)$ at time $t_0+\Delta$, is set to 0 and the derivative $f'(t_0)$ is matched to that at the cubic spline starting point at time $t_0$.

Thus, the only case when an initial derivative might not be identically equal to zero is if the parameter value is already ramping. This happens, as described above, if a new target value is specified before the old target value has been reached. Then as shown in FIG. 3 at time $t_1$ a new target volume level (indicated by the volume level 60) is specified before the volume parameter arrives at level 54, at time $t_1$. The new target volume level in this case is a volume level 60 having as shown a zero derivative. Then by resetting a transition interval timer at time $t_1$ over the additional time interval Δ extending through time $t_1$ plus Δ and recomputing the polynomial coefficients using a second cubic spline polynomial g(t), one matches the end point values at times $t_1$ and $t_1+\Delta$ and matches the derivatives at the endpoints to ensure continuity and smoothness in one continuous change in the derivative.

It is to be understood that the one time dynamic change at time $t_1$ in FIG. 3 is not limiting; there may be a series of input events changing the parameter values. At each such event a transition interval timer as described below is reset and a new cubic spline polynomial is computed. In one embodiment of the invention a preferred transition period Δ is 10 milliseconds, but this is not limiting.

Exemplary equations for solving for the polynomial values of the cubic spline are as follows:

1. If no ramping is occurring, then the derivative is zero. This may also be folded into the case where there is ramping, by setting the coefficients for the polynomial appropriately. That is, the coefficients of the portions of the polynomial involving t are set equal to zero, and the last (constant) coefficient is set equal to a constant.

2. If ramping is currently occurring, the cubic spline polynomial is of the form $f(t)=at^3+bt^2+ct+d$. t is the current time and is normalized as a value between −1 and 1 for convenience of calculation. Then $f'(t)=3at^2+2bt+c$. Hence all values are known, both for the derivatives and the actual parameter value at each spline endpoint. Hence having four known values and four unknowns (a, b, c and d) it is easy to solve the equation for a, b, c, and d:

Let $A=f(t_1)=at_1^3+bt_1^2+ct_1+d$;

let $B=f'(t_1)=3at_i^2+2bt_1+c$

Then the boundary conditions are for $g(t)=a't^3+b't^2+c't+d'$:

let $g(-1)=A$, so $-a'+b'-c'+d'=A$, let $g'(-1)=B$, so $3a'-2b'+c'=B$, let $g(1)=T$, so $a'+b'+c'+d'=T$, where T is the target value, let $g'(1)=0$, so $3a'+2b'+c=0$.

Then solving for four unknowns using four equations:

$$b'=-B/4$$

$$d'=(A+T)/2+B/4$$

$$a'=B/4+(A-T)/4$$

and $$c'=3(T-A)/4-B/4$$

At the end of the transition interval, the target value of the parameter is understood to be constant and value of the parameter and also the spline coefficients are set to a"=b"= c"=0, and d"=T, where T is the target value of the parameter. This aids in the computation of the next spline coefficient since separate computer code is not needed for the next calculation but the same code can be used again.

Hence the execution of the transition ramp synthesis in accordance with the present invention is that such that ramping occurs only during a ramping state. When the ramping state is completed, one enters a non-ramping state where the cubic spline polynomial coefficients are set to zero for the first three coefficients and the last coefficient is set to a constant, hence in effect "shutting down" ramping.

Advantageously the present approach allows a relatively short ramping interval without introduction of audio artifacts. This interval is much shorter than in prior art ramping techniques. Also in accordance with the present invention one may advantageously dynamically adjust the output waveform during the ramping interval without introducing any artifacts; this is difficult with prior art approaches. Thus it is possible to have fast and quiet volume changes both up or down.

During each ramping interval, a counter counts down to zero from a value which is set to determine the length of the transition (ramping) during the ramping interval. For instance 64 time samples are taken and referred to collectively as a "tick". In one embodiment, a ramp has a duration of 8 or 16 ticks. Also in accordance with the invention stereo sound is supported with left and right sound channels. In this case a separate cubic spline is calculated for each channel.

Figure 4:
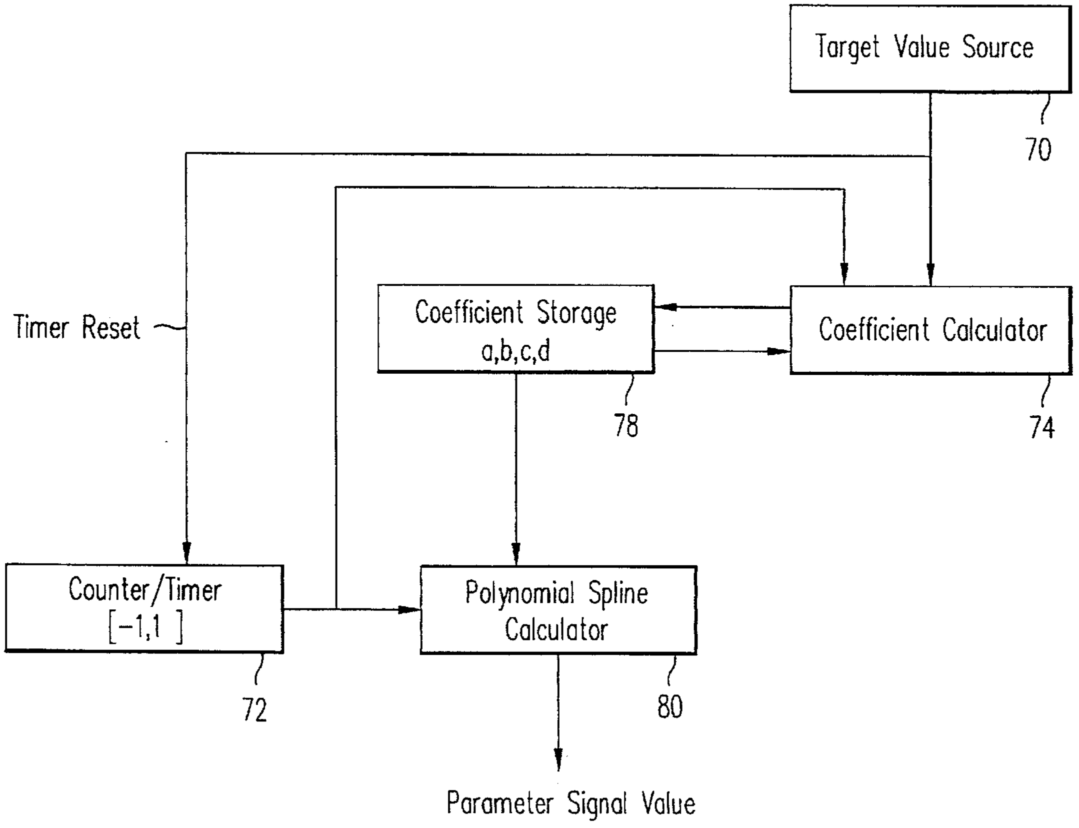
FIG. 4 shows diagrammatically a process and apparatus for carrying out the present invention.

FIG. 4 shows diagrammatically a method and apparatus (e.g. computer program) for carrying out the present spine fitting. A source 70 of target values (e.g. user control or other source) provides the target parameter and derivative values to a coefficient calculator 74, which performs as described above endpoint matching of the cubic spline for the ramp. The resulting spline coefficients a, b, c, and d are stored in coefficient storage 78. Counter/timer 72 counts from (normalized) time −1 to 1, to operate polynomial spline calculator 80 during this time interval, so as to provide the output parameter signal value. Timer 72 is reset by the source 70, and also times operation of coefficient calculator 74 so calculator 74 only operates during the ramping state.

This process is carried out (in one embodiment) by a digital signal processing chip having parallel functional units. See copending and commonly owned U.S. patent application Ser. No. 08/541,565 filed Oct. 10, 1995, inventors James T. Battle, Andy C. Hung, and Stephen C. Purcell, entitled "Multi-Media Engine Including Processor Using Variable Length Instructions" incorporated herein by reference in its entirety. The processor as described in that disclosure allows calculation of for instance four or more individual calculations simultaneously.

Further as described above, one embodiment of the present invention is in the form of a computer program (software) for sound (music) synthesis. An example of such a computer program is shown in the Microfiche Appendix which is a part of this disclosure and which is in assembly language and conventionally commentated for understanding. This program includes features not described herein (as evident from the comments).

With reference to the code in the Microfiche Appendix, which is paginated at the bottom of each page, the first module entitled waveout_structs.h beginning at page 1 conventionally defines the data structures.

At page 3 (in the middle) the sample size is described: at 44.1 KHz there are 64 samples per tick and 8 ticks, defining a transition length (ramp length) of about 11.6 milliseconds. Of course these parameters may be varied.

The core of this program begins at page 5 in the module entitled waveout_tick.x which is called once per tick. This code calculates the parameter, for instance the volume, as described above. The ramping function begins at page 11, at which is shown how the cubic spline polynomials are calculated. The code at the center of page 11 shows how when the ramping is completed the program reverts to a non-ramping state (see bottom of page 11) at which time the coefficients are set to be constants, thus in effect disabling ramping.

The variable temp1 is the value which is incremented for the ramp value between the values of −1 and 1 (a normalized ramp duration).

The "mad" operation (multiply and add) shown in the upper portion of page 11 is used multiple times to calculate the cubic spline polynomials, to ultimately calculate $ar^2+br^2+cr+d$ using the Horner's rule calculation.

Note the reference to the left and right stereo channels at the bottom of page 12 allowing each channel to have its own ramp using the cubic spline approach.

Beginning on page 19, the module entitled waveout_msgs.x handles message transactions (data/address inputs) from the audio process manager here designated XAPM which is a portion of a related computer program for sound synthesis; this relates to the shell/operating system as described in a commonly owned patent application invented by Avery L. Wang and entitled "A System and Method for Stack Based Processing of Multiple Realtime Audio Tasks" filed Nov. 9, 1995, Ser. No. 08/556,420, and a commonly owned patent application invented by Denis Gulsen and entitled "A System and Method for Fast Context Switch Between Tasks," filed Nov. 9, 1995, Ser. No. 08/556,416, both incorporated herein by reference in their entirety.

Beginning at page 20 of the Microfiche Appendix, there is a code for finite state machine description for the states of ramping up, playing, ramping down, pausing, and closing. Each state pertains to the state of the actual sound, for instance sound provided from a sound file or a CD player. Each state involves potential use of the spline fitting in accordance with the present invention and hence calls, if needed, the spline fitting code. Note that typically there is a transition requiring the spline fitting if one starts playing music, stops playing music, pauses while playing music, or closes the music. This code is further referred to by the module entitled wo_setup on page 22 and following.

Moreover the code beginning at page 25 shows calculation of the ramping spline polynomials over the interval −1 to 1 where there is a dynamic change in the sound parameter, as described above. This code shows the calculation described above of the various coefficients in this case, continuing over to page 26.

The code at pages 27 through 30 involves the above-described play, pause, and close states to ramp the sound up or down as appropriate to avoid sound artifacts during the determinative transition period. Note that the close function is typically used in the note stealing situation described above.

This disclosure is illustrative and not limiting; further modifications will be apparent to one skilled in the art in the light of this disclosure and are intended to fall within the scope of the appended claims.

I claim:

1. A method of controlling a transition in a parameter of a sound with respect to time, comprising the steps of:

determining a first level of the sound parameter at an initial time, and a second level of the sound parameter at a target time following the initial time; and fitting a spline function between the first level and the second level over a time increment between the initial time and the target time, wherein the spline function is a smoothly changing value of the sound parameter.

2. The method of claim 1, wherein the spline function is a cubic spline function.

3. The method of claim 1, wherein the sound parameter is a volume envelope.

4. The method of claim 1, wherein the sound parameter is a characteristic frequency.

5. The method of claim 1, wherein at both the initial time and at the target time, a derivative with respect to time of the spline function is equal to zero.

6. The method of claim 1, wherein a derivative of the spline function changes smoothly over the time increment.

7. The method of claim 1, wherein the spline function is expressed as $at^3+bt^2+ct+d$, where t represents time and a, b, c, and d are constants.

8. The method of claim 1, further comprising the step, during a period when there is no transition in the sound parameter, of turning off a function of fitting the spline.

9. The method of claim 1, wherein the transition in the sound parameter is a transition which reduces the parameter to a zero level.

10. The method of claim 1, wherein the transition in the sound parameter is a transition which increases the parameter from a zero level.

11. The method of claim 1, further comprising the steps of:

changing the second level of the sound parameter to a third level, before the sound parameter reaches the second level; and dynamically altering the spline function to smoothly change the sound parameter to the third level.

12. The method of claim 1, wherein the target time is not greater than 1/100 second after the initial time.

13. The method of claim 7, wherein t is an interval normalized between values of −1 and 1.

14. The method of claim 11, where the step of dynamically altering comprises the steps of:

matching a value of the sound parameter and its derivative with respect to time during the transition to the value of the sound parameter and its derivative with respect to time immediately before and after the transition; and setting a derivative of the value of the sound parameter, at an end of the transition, to zero.

15. The method of claim 14, wherein the spline function is expressed as $at^3+bt^2+ct+d$, where t represents time, and where T is the third level, A is an initial value of the sound parameter, and B is the derivative of an initial value of the sound parameter, then:

$b=-B/4,$ $d=(A+T)/2+B/4,$ $a=B/4+(A-T)/4$ and $c=3(T-A)/4-B/4.$

16. An apparatus for controlling a transition in a sound parameter with respect to time, comprising:

means for determining a first level of the sound parameter at an initial time, and a second level of the sound parameter at a target time following the initial time; and means for fitting a spline function between the first level and the second level over a time increment between the initial time and the target time, wherein the spline function is a smoothly changing value of the sound parameter.

17. The apparatus of claim 16, wherein the spline function is a cubic spline function.

18. The apparatus of claim 16, wherein the sound parameter is a volume envelope.

19. The apparatus of claim 16, wherein the sound parameter is a characteristic frequency.

20. The apparatus of claim 16, wherein at both the initial time and at the target time, a derivative with respect to time of the spline function is equal to zero.

21. The apparatus of claim 16, wherein a derivative of the spline function changes smoothly over the time increment.

22. The apparatus of claim 16, wherein the spline function is expressed as $at^3+bt^2+ct+d$, where t represents time and a, b, c, and d are constants.

23. The apparatus of claim 16, further comprising means for turning off the means for fitting the spline function during a period when there is no transition in the sound parameter.

24. The apparatus of claim 16, wherein the transition in the sound parameter is a transition which reduces the parameter to a zero level.

25. The apparatus of claim 16, wherein the transition in the sound parameter is a transition which increases the parameter from a zero level.

26. The apparatus of claim 16, further comprising:

means for changing the second level of the sound parameter to a third level, before the sound parameter reaches the second level; and means for dynamically altering the spline function to smoothly change the sound parameter to the third level.

27. The apparatus of claim 16, wherein the target time is not greater than 1/100 second.

28. The apparatus of claim 22, wherein t is an interval normalized between values of −1 and 1.

29. The apparatus of claim 26, wherein the means for dynamically altering includes:

means for matching a value of the sound parameter and its derivative with respect to time during the transition to the value of the sound parameter and its derivative with respect to time immediately following before and after the transition; and means for setting a derivative of the value of the sound parameter, at an end of the transition, to zero.

30. The apparatus of claim 29, wherein the spline function is expressed as $at^3+bt^2+ct+d$, where t represents time, and where T is the third level, A is an initial value of the sound parameter, and B is a derivative of an initial value of the sound parameter, then:

$b=-B/4,$ $d=(A+T)/2+B/4,$ $a=B/4+(A-T)/4,$ and $c=3(T-A)/4-B/4.$

31. An apparatus for controlling a sound parameter during a transition in the sound parameter, the transition being from a first level to a second level of the sound parameter, comprising:

a timer for timing a duration of the transition; and a cubic spline calculator operatively coupled to the timer and operating during the timed duration, wherein the cubic spline calculator fits a cubic spline between the first level and the second level.

32. A method for note stealing to synthesize music, comprising the steps of:

generating a first note using an oscillator;

stopping the generation of the first note by reducing its volume to zero;

generating a second note using the oscillator; and during a transition from the stopping generation of the first note to the generating of the second note, fitting a spline function between the volume of zero of the first note to a volume of the second note, wherein the spline function is a smoothly changing value of the volume.

33. A method for note stealing by turning off a quieter note in favor of another note to synthesize music, comprising the steps of:

generating a first note using an oscillator;

stopping the generation of the first note by reducing its volume to zero;

generating a second note using the oscillator; and during a transition of stopping the generation of the first note, fitting a spline function between the volume of the first note at a beginning of the transition and the volume of zero, wherein the spline function is a smoothly changing value of the volume of the first note.

* * * * *